United States Patent
Tremel

(10) Patent No.: US 8,148,885 B2
(45) Date of Patent: Apr. 3, 2012

(54) METHODS OF CONDITIONING GETTER MATERIALS

(75) Inventor: James Daniel Tremel, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 912 days.

(21) Appl. No.: 11/721,739

(22) PCT Filed: Dec. 16, 2005

(86) PCT No.: PCT/US2005/046323
§ 371 (c)(1), (2), (4) Date: Apr. 21, 2008

(87) PCT Pub. No.: WO2006/073824
PCT Pub. Date: Jul. 13, 2006

(65) Prior Publication Data
US 2008/0272694 A1    Nov. 6, 2008

Related U.S. Application Data

(60) Provisional application No. 60/640,569, filed on Dec. 30, 2004.

(51) Int. Cl.
*H01J 1/62* (2006.01)
(52) U.S. Cl. ........................ 313/483; 428/34.1
(58) Field of Classification Search ...... 117/2; 313/483; 428/34.1
See application file for complete search history.

(56) References Cited

U.S. PATENT DOCUMENTS

| 4,322,394 | A | * | 3/1982 | Mezey et al. | 423/244.11 |
|---|---|---|---|---|---|
| 4,481,018 | A | * | 11/1984 | Coe et al. | 95/130 |
| 4,544,378 | A | * | 10/1985 | Coe et al. | 95/130 |
| 5,152,813 | A | * | 10/1992 | Coe et al. | 95/103 |
| 5,258,058 | A | * | 11/1993 | Coe et al. | 95/96 |
| 5,354,360 | A | * | 10/1994 | Coe et al. | 95/101 |
| 5,417,957 | A | * | 5/1995 | Coe et al. | 423/700 |
| 5,419,891 | A | * | 5/1995 | Coe et al. | 423/700 |
| 5,912,422 | A | * | 6/1999 | Bomard et al. | 95/96 |
| 5,931,713 | A | * | 8/1999 | Watkins et al. | 445/55 |
| 5,945,780 | A | * | 8/1999 | Ingle et al. | 313/495 |
| 6,033,278 | A | * | 3/2000 | Watkins et al. | 445/41 |
| 6,303,238 | B1 | | 10/2001 | Thompson et al. | 428/690 |
| 6,477,222 | B1 | | 11/2002 | Nystrom et al. | 378/16 |
| 6,673,400 | B1 | * | 1/2004 | Bedinger et al. | 428/34.1 |

(Continued)

FOREIGN PATENT DOCUMENTS

EP    1 191 612 A2    3/2002

(Continued)

OTHER PUBLICATIONS

Campbell, I. H. et al., "Excitation Transfer Processes in a Phosphor-Doped Poly (p-phenylene vinylene) Light-Emitting Diode", Physical Review B., vol. 65, 085210-1-085210-8.

(Continued)

*Primary Examiner* — Nimeshkumar Patel
*Assistant Examiner* — Mary Ellen Bowman
(74) *Attorney, Agent, or Firm* — Woodcock Washburn LLP

(57) ABSTRACT

Provided are methods for conditioning a getter material, comprising subjecting the getter material to microwave radiation. Electronic devices uses the conditioned getter materials and methods of making such electronic devices are also provided.

15 Claims, 3 Drawing Sheets

U.S. PATENT DOCUMENTS

| | | | |
|---|---|---|---|
| 6,878,657 B2 * | 4/2005 | Jasra et al. | 502/64 |
| 2001/0019782 A1 | 9/2001 | Igarashi et al. | 428/690 |
| 2002/0042240 A1 * | 4/2002 | Fujimura et al. | 445/24 |
| 2002/0053401 A1 | 5/2002 | Ishikawa et al. | |
| 2002/0167262 A1 | 11/2002 | Porter et al. | 313/483 |
| 2004/0244673 A1 | 12/2004 | Yates et al. | 117/2 |

FOREIGN PATENT DOCUMENTS

| | | |
|---|---|---|
| EP | 1 191 614 A2 | 3/2002 |
| JP | HEI 9-210290 | 8/1997 |
| JP | 2002-203675 | 7/2002 |
| WO | WO 00/70655 | 11/2000 |
| WO | WO 01/41512 A1 | 6/2001 |
| WO | WO 02/02714 A2 | 1/2002 |
| WO | WO 02/15645 A1 | 2/2002 |
| WO | WO 02/43098 A1 | 5/2002 |

OTHER PUBLICATIONS

Gustafsson, G. et al., "Flexible Light-Emitting Diodes made from Soluble Conducting Polymer", Nature, 1992, 357, 477-479.

O'Brien, D.F. et al., "Electrophosphoresence from a Doped Polymer Light Emitting Diode", Synthetic Metals, 2001, 116(1-3), 379-383.

Othmer, Kirk, Encyclopedia of Chemical Technology, 1996, 18, $4^{th}$ Edition, 837-860.

* cited by examiner

METHODS OF CONDITIONING GETTER MATERIALS

CROSS REFERENCE TO RELATED APPLICATIONS

This application is the National Stage of International Application No. PCT/US2005/046323, filed Dec. 16, 2005, which claims the benefit of U.S. Provisional Application No. 60/640,569, filed Dec. 30, 2004, the disclosure of which is incorporated herein by reference in its entirety.

FIELD

This disclosure relates generally to methods of conditioning getter materials, for example, those found in organic electronic devices, and materials and methods for fabrication of the same.

BACKGROUND

Organic electronic devices define a category of products that include an active layer. Protecting an organic electronic device from environmental factors, such as oxygen and moisture, aids in maintaining the integrity of the active layer, and thereby the shelf-life of the electronic device. Thus, the organic electronic device often includes "getter" materials, such as adsorbent and absorbent materials. A getter material can be placed within an enclosure containing the organic electronic device to protect the materials most sensitive to contaminant gases, for example, the active layers.

Manufacture of organic electronic devices presents certain process limitations to the use of getters. For example, some getters generally require heat for activation, typically at temperatures of up to about 650° C. In contrast, active organic materials in organic electronic devices typically do not tolerate temperatures much above about 300° C. Thus, activation has been accomplished by heating to high temperatures (i.e., about 400° C.) inside of a convection oven ("Thermal Swing Adsorption") or subjecting the zeolite to a very "dry" environment using purge gas and/or vacuum to strip away water molecules ("Pressure Swing" process). High manufacturing costs are associated with both these scenarios due to long process times and expensive heating/vacuum equipment.

Thus, there remains a need for simplifying and expediting the manufacturing of such devices. In addition, improved processes for activating getter materials are needed.

SUMMARY

Provided are methods for conditioning a getter material, comprising subjecting the getter material to microwave radiation. Electronic devices uses the conditioned getter materials and methods of making such electronic devices are also provided.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
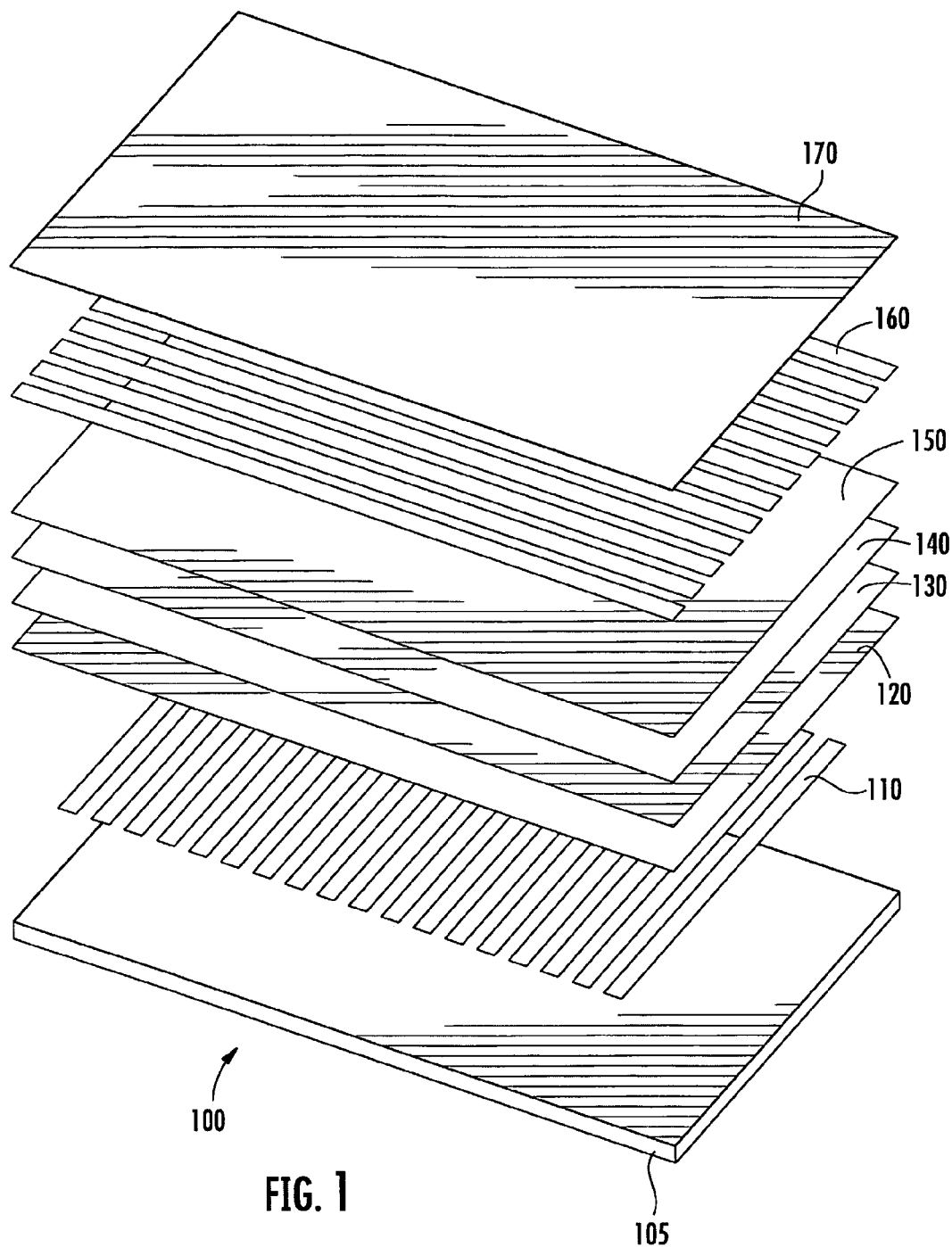
FIG. 1 is a schematic diagram of an organic electronic device.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Methods of the present invention include activating a getter material by exposing the getter material to microwave radiation. In one embodiment, energizing water bound to components of the getter material, for example, a zeolite material, with microwave radiation is fast and uses inexpensive equipment leading to lower manufacturing costs without sacrificing performance. Moreover, a substrate, for example, a lid, on which a getter material can be located generally remains cooler than the getter material in the presence of microwave radiation.

In addition to speed and ease, this process is desirable because the microwave energy is believed to couple directly to the water in the getter material, for example, in a zeolite matrix. This means that the getter material does not need to reach such high temperatures for successful regeneration. Thus, microwave dehydration is more efficient than thermal (heat) or pressure changes.

In some embodiments, the getter material is exposed to a temperature of 300° C. or less. The getter material can be any material that has drying capabilities, for example, materials that are absorbent, adsorbent, or are a combination of both are desirable. In one embodiment, the getter material comprises a molecular sieve, for example, a zeolite. The getter material is subjected to microwave radiation for shorter times than are required as compared to conditioning in a convection oven. For example, in some instances, the getter material is heated with microwave radiation for five minutes or fewer. And, in another embodiment, the heating is for three minutes or fewer.

In another embodiment, methods of making an electronic device comprising heating a getter material using microwave radiation and encapsulating the getter material within the electronic device are provided. The temperature during the heating step can be, for example, 300° C. or less. In one embodiment, the getter material is heated for 5 minutes or fewer. In another embodiment, the getter material is heated for 3 minutes or fewer.

Other methods can further comprise cooling the getter material prior to encapsulating the getter material.

The methods, in certain embodiments, further comprise layering the getter material on a substrate. The getter material can be deposited, for example, as a thin film. In one embodiment, a thickness of the getter material is less than or equal to 100 μm. In another embodiment, the thickness is less than or equal to 1 μm. In one embodiment, the electronic device comprises a substrate, an anode layer, a cathode layer, and an active layer.

Other methods include assembling an electronic device comprising providing a substrate comprising a layer of getter material; providing an anode layer, a cathode layer, and an active layer; and exposing the substrate and the getter material to microwave radiation. In one embodiment, the heating step occurs at a temperature of 300° C. or less. In one embodiment, the substrate and the getter material are exposed to microwave radiation for 5 minutes or fewer. In another embodiment, the substrate and the getter material are exposed to microwave radiation for 3 minutes or fewer.

Other methods further include depositing the getter material on a substrate. In one embodiment, a thickness of the getter material is less than or equal to 100 µm. In another embodiment, the thickness is less than or equal to 1 µm.

An exemplary electronic device comprises a substrate, an active layer, and a getter material; wherein the getter material has been exposed to a temperature of 300° C. or less by microwave radiation. In one example, the getter material is deposited on the substrate. In one embodiment, the getter material comprises 0.1% or less water by weight of getter material. It may also be desirable to cool the getter material prior to encapsulating it within the electronic device.

Getter Material

In one embodiment, the getter material comprises a molecular sieve. In another embodiment, a substantial portion of the particles have a size in the range of from 2-6 microns.

In one embodiment, the molecular sieve comprises a zeolite, either naturally occurring or synthetic. Well-known zeolites include chabazite (also referred to as zeolite D), clinoptilolite, erionite, faujasite (also referred to as zeolite X and zeolite Y), ferrierite, mordenite, zeolite A, and zeolite P. Detailed descriptions of the above-identified zeolites, as well as others, may be found in D. W. Breck, *Zeolite Molecular Sieves*, John Wiley and Sons, Present York (1974), hereby incorporated by reference. For example, type 3A, 4A and 13X zeolites all have the ability to adsorb water molecules and are presently preferred as the adsorbent molecular sieve for making the present moisture getters. Such zeolites comprise $Na_2O$, $Al_2O_3$ and $SiO_2$.

Certain adsorbent getters can adsorb gaseous contaminants in addition to moisture, such as gaseous $H_2$ and $O_2$. An example of a commercially available, solid getter tablet based on zeolite technology that can be made to adsorb contaminant gases, as well as moisture, is described in European Patent Application No. WO 02/430098 A1 by Synetix.

Non-limiting examples of clays that are suitable as the inorganic binder in an aqueous dispersion for making a layer of getter material secured to a surface include attapulgite, kaolin, sepiolite, palygorskite, kaolinite, plastic ball clays, clays of the attapulgite or kaolin types, bentonite, montmorillonite, illite, chlorite, bentonite-type clay, some of which also absorb moisture, and mixtures thereof. Magnesium aluminosilicate clays are presently preferred.

A moisture getter can be formed from particles of a wafer that is commercially available under the trade name TRI-SORB® (Sud-Chemie, Belen, N. Mex.). TRI-SORB® is available as a compressed tablet comprising pre-calcined particles of an A4 zeolite in a binder matrix of magnesium aluminosilicate clay. The A4 zeolite in TRI-SORB® consists of aluminum and silicon oxides in approximately equal amounts with sodium as the counter ion. The tablets are ground to form finely divided particles comprising a zeolite in a matrix of clay.

Additional examples of inorganic binders that can be used in the present methods are glass frits. Non-limiting examples of glass frits that are suitable for inclusion in the inorganic binder in the present methods include those that comprise at least one of PbO, $Al_2O_3$, $SiO_2$, $B_2O_3$, ZnO, $Bi_2O_3$, $Na_2O$, $Li_2O$, $P_2O_5$, NaF and CdO, and MO where O is oxygen and M is selected from Ba, Sr, PB, Ca, Zn, Cu, Mg, and mixtures thereof. For example, the inorganic binder can be or comprise a glass frit comprising 10-90 wt % PbO, 0-20 wt % $Al_2O_3$, 0-40 wt % $SiO_2$, 0-15 wt % $B_2O_3$, 0-15 wt % ZnO, 0-85 wt % $Bi_2O_3$, 0-10 wt % $Na_2O$, 0-5 wt % $Li_2O$, 0-45 wt % $P_2O_5$, 0-20 wt % NaF, and 0-10 wt % CdO. In another example, the inorganic binder can be a glass frit comprising: 0-15 wt % PbO, 0-5 wt % $Al_2O_3$, 0-20 wt % $SiO_2$, 0-15 wt % $B_2O_3$, 0-15 wt % ZnO, 0-85 wt % $Bi_2O_3$, 0-10 wt % $Na_2O$, 0-5 wt % $Li_2O$, 0-29 wt % $P_2O_5$, 0-20 wt % NaF, and 0-1.0 wt % CdO. Glass frit can be ground to provide powder sized particles (e.g., 2-6 microns) in a ball mill.

Devices

Figure 3:
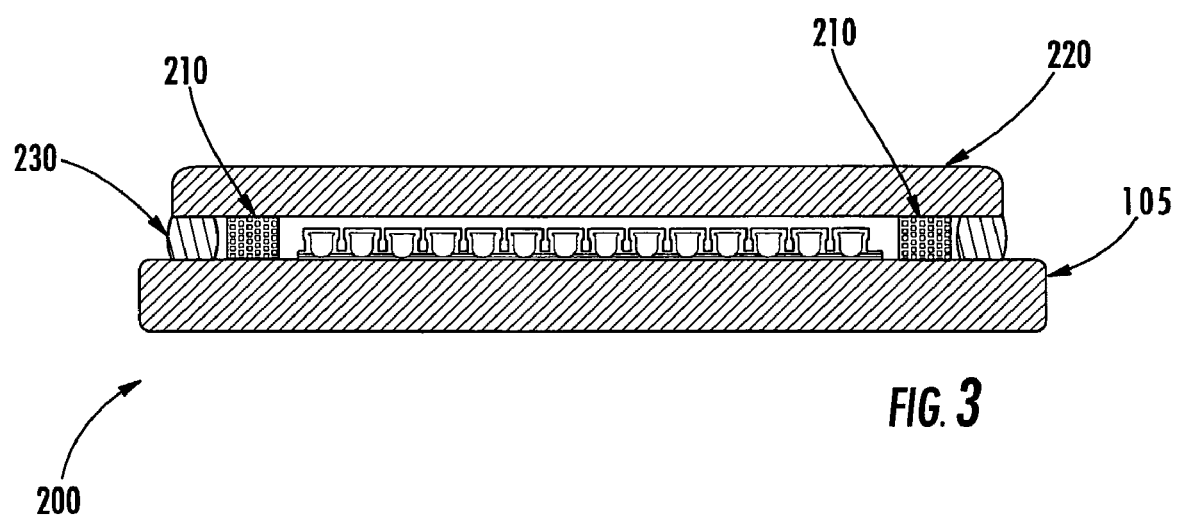
FIG. 3 is a schematic diagram of an electronic device.

With regard to FIG. 3, an electronic device 200 comprises a lid 220 and a display substrate 105. A getter material, also known as a getter material, 210 can be located on the lid 220 to the electronic device 200. The getter material may be any desired thickness, and therefore, may or may not span the entire distance between the lid 220 and the substrate 105. A perimeter seal epoxy 230 adheres the lid 220 to the display substrate 100. Depositing or patterning getter materials onto the lid can be done, for example, as a thin film or other desirable methods.

Referring to FIG. 1, an exemplary organic electronic device 100 is shown. The device 100 includes a substrate 105. The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8, 10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in *Flexible Light-Emitting Diodes Made From Soluble Conducting Polymer, Nature* 1992, 357, 477-479. At least one of the anode and cathode should be at least partially transparent to allow the generated light to be observed.

An optional buffer layer 120, such as hole transport materials, may be deposited over the anode layer 110, the latter being sometimes referred to as the "hole-injecting contact layer." Examples of hole transport materials suitable for use as the layer 120 have been summarized, for example, in Kirk Othmer, Encyclopedia of Chemical Technology, Vol. 18, 837-860 (4th ed. 1996). Both hole transporting "small" molecules as well as oligomers and polymers may be used. Hole transporting molecules include, but are not limited to: N,N' diphenyl-N,N'-bis(3-methylphenyl)-[1,1'-biphenyl]-4,4'-diamine (TPD), 1,1 bis[(di-4-tolylamino) phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), a-phenyl 4-N,N-diphenylaminostyrene (TPS), p(diethylamino)benzaldehyde diphenylhydrazone (DEH), triphenylamine (TPA), bis[4 (N,N-diethylamino)-2-methylphenyl](4-methylphenyl)methane (MPMP), 1 phenyl-3-[p-(diethylamino) styryl]-5-[p-(diethylamino)phenyl]pyrazoline (PPR or DEASP), 1,2 trans-bis(9H-carbazol-9-yl)cyclobutane (DCZB), N,N,N',N' tetrakis(4-methylphenyl)-(1,1'-biphenyl)-4,4'-diamine (TTB), and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

An organic layer 130 may be deposited over the buffer layer 120 when present, or over the first electrical contact layer 110. In some embodiments, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material (e.g., in layer 130). Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices of the invention, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT application WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in *Synth. Met.* 2001, 116 (1-3), 379-383, and Campbell et al., in Phys. Rev. B, Vol. 65 085210.

A second electrical contact layer 160 is deposited on the organic layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Lithium-containing and other compounds, such as LiF and $Li_2O$, may also be deposited between an organic layer and the cathode layer to lower the operating voltage of the system.

An electron transport layer 140 or electron injection layer 150 is optionally disposed adjacent to the cathode, the cathode being sometimes referred to as the "electron-injecting contact layer."

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be a layer (not shown) between the anode 110 and hole transport layer 120 to facilitate positive charge transport and/or bandgap matching of the layers, or to function as a protective layer. Other layers that are known in the art or otherwise may be used. In addition, any of the above-described layers may comprise two or more sub-layers or may form a laminar structure. Alternatively, some or all of anode layer 110 the hole transport layer 120, the electron transport layers 140 and 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layers 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices can be prepared employing a variety of techniques. These include, by way of non-limiting exemplification, vapor deposition techniques and liquid deposition. Devices may also be sub-assembled into separate articles of manufacture that can then be combined to form the device.

Note that not all of the activities described above in the general description are required, that a portion of a specific activity may not be required, and that one or more further activities may be performed in addition to those described. Still further, the order in which activities are listed are not necessarily the order in which they are performed.

DEFINITIONS

"Conditioning" refers to activating, reactivating, or regenerating materials, such as getter materials, so as to drive off substantially all volatiles, including, but not limited to, moisture and contaminant gases.

As used herein, the term "adsorbent" and "adsorbing" refer to a solid material that has the ability to cause molecules of gases or vapors to condense on its surface and be gettered without changing the adsorbent physically or chemically.

As used herein, the term "clay" means a mineral particle composition having a diameter less than $1/256$ mm (4 microns) and composed of a loosely defined group of hydrous silicate minerals, essentially of aluminum.

As used herein, the term "gas" means a phase of matter that expands indefinitely to fill a containment vessel that is characterized by a low density. The phrase "contaminant gases" as used herein, includes moisture, oxygen, hydrogen, hydrocarbon vapors, and all manner of gases that may be in the atmosphere or generated internally in an organic electric device.

As used herein, the term "getter" or "gettering" means a substance that adsorbs or the act of adsorbing contaminant gases that cause damage to organic layers in electronic devices. The getter materials may also contain a minor proportion of materials that absorb water. For example, certain clays and glass frits that are useful as the inorganic binder in the getters made according to the present methods will absorb water. In one embodiment, the getter comprises a molecular sieve.

As used herein, the term "hermetically" means a substantially complete seal against the escape or entry of air.

As used herein, the term "molecular sieve" means a crystalline, porous, molecular structure that selectively adsorbs or rejects molecules based on differences in molecular size or shape. The molecular sieve particles suitable for the present invention include alkaline metal oxides, alkaline earth metal oxides, sulfates, metal halides, and perchlorates and mixtures thereof. In one embodiment, the molecular sieve is a zeolite.

The use of "a" or "an" are employed to describe elements and components of the invention. This is done merely for convenience and to give a general sense of the invention. This description should be read to include one or at least one and the singular also includes the plural unless it is obvious that it is meant otherwise.

The term "active" when referring to a layer or material is intended to mean a layer or material that exhibits electronic or electro-radiative properties. An active layer material may emit radiation or exhibit a change in concentration of electron-hole pairs when receiving radiation. Thus, the term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

The term "substrate" is intended to mean a workpiece that can be either rigid or flexible and may include one or more layers of one or more materials, which can include, but are not limited to, glass, polymer, metal, or ceramic materials, or combinations thereof. In one non-limiting example, the substrate is a lid.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

EXAMPLES

The concepts described herein will be further described in the following examples, which do not limit the scope of the invention described in the claims.

Example 1

Figure 2:
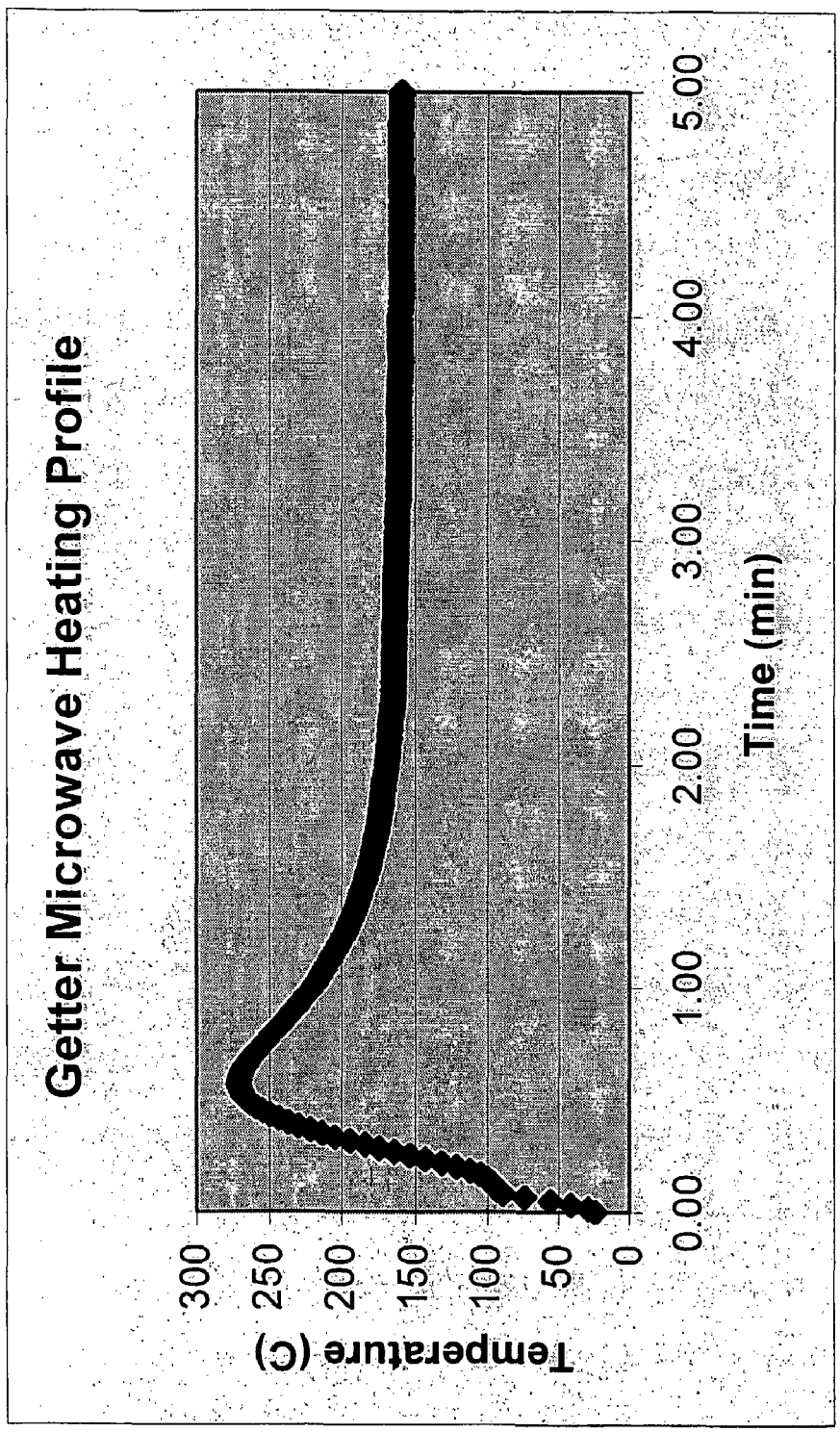
FIG. 2 shows a temperature profile during a microwave heating cycle of a getter material.

A zeolite sample was heated in a domestic type microwave oven. FIG. 2 shows the temperature profile during the heating cycle. The sharp rise in temperature was due to water adsorption of the microwave energy. As the water is removed, the temperature drops because the zeolite can not adsorb microwave energy as efficiently as water.

Example 2

A substrate, for example a lid made of glass, having a layer of zeolite deposited thereon is obtained. The lid is handled under atmospheric conditions and humidity.

An industrial grade microwave oven is placed in a nitrogen-controlled environment (for example, a glove box).

The lid is placed in the industrial grade microwave oven. The zeolite located on the lid is then conditioned by exposure to a specified power of microwave radiation for a specified time. It is expected that the zeolite temperature will be 300° C. or less, and that the substrate temperature will be cooler than the zeolite.

Several lids having the same and differing thicknesses and types of zeolite will be tested under varying conditions of power and time.

After having been exposed to microwave radiation under varying powers and duration, and optionally being allowed to cool, conditioned zeolites deposits on lids will be encapsulated into electronic devices, for example devices using organic light-emitting devices, where the devices each comprise a display substrate and a lid. The devices are then placed into accelerated storage environment under conditions of either 85° C. and 85% relative humidity or 60° C. and 90% relative humidity. Time to failure of the devices, as measured by reduction in pixel size, is measure for each device.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed:

1. A method for conditioning a getter material comprising heating the getter material with microwave radiation wherein the getter material is exposed to a temperature of 300° C. or less and exposed to the microwave radiation for three minutes or fewer.

2. The method of claim 1 wherein the getter material comprises a molecular sieve.

3. The method of claim 2 wherein the molecular sieve comprises zeolite.

4. A method of making an electronic device comprising conditioning a getter material by heating the getter material using microwave radiation wherein the getter material is exposed to a temperature of 300° C. or less and exposed to the microwave radiation for three minutes or fewer; and encapsulating the getter material within the electronic device.

5. The method of claim 4 further comprising cooling the getter material prior to encapsulating the getter material.

6. The method of claim 4 wherein the getter material comprises a molecular sieve.

7. The method of claim 6 wherein the molecular sieve comprises a zeolite.

8. The method of claim 4 further comprising layering the getter material directly on a substrate.

9. The method of claim 8 wherein a thickness of the getter material is less than or equal to 100 μm.

10. The method of claim 9 wherein the thickness is less than or equal to 1 μm.

11. The method of claim 4 wherein the electronic device comprises a substrate, an anode layer, a cathode layer, and an active layer.

12. A method of assembling an electronic device comprising providing a substrate comprising a layer of getter material; providing an anode layer, a cathode layer, and an active layer; and conditioning the getter material by exposing the substrate and the getter material to microwave radiation wherein the getter material is exposed to a temperature of 300° C. or less and wherein the substrate and the getter material are exposed to the microwave radiation for three minutes or fewer.

13. The method of claim 12 further comprising layering the getter material directly on a substrate.

14. The method of claim 12 wherein a thickness of the getter material is less than or equal to 100 μm.

15. The method of claim 14 wherein the thickness is less than or equal to 1 μm.

* * * * *